(12) United States Patent
Liu et al.

(10) Patent No.: US 11,114,313 B2
(45) Date of Patent: Sep. 7, 2021

(54) WAFER LEVEL MOLD CHASE

(71) Applicant: Taiwan Semiconductor Manufacturing Co., Ltd., Hsinchu (TW)

(72) Inventors: Hsien-Wen Liu, Hsinchu (TW); Po-Hao Tsai, Zhongli (TW); Yi-Wen Wu, Xizhi (TW); Shin-Puu Jeng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 137 days.

(21) Appl. No.: 16/413,915

(22) Filed: May 16, 2019

(65) Prior Publication Data

US 2020/0365421 A1 Nov. 19, 2020

(51) Int. Cl.
*H01L 21/56* (2006.01)
*B29C 45/34* (2006.01)
*B29C 45/27* (2006.01)
*B29L 31/34* (2006.01)

(52) U.S. Cl.
CPC ............ *H01L 21/565* (2013.01); *B29C 45/27* (2013.01); *B29C 45/34* (2013.01); *H01L 21/561* (2013.01); *H01L 21/566* (2013.01); *B29L 2031/3481* (2013.01)

(58) Field of Classification Search
CPC .......... B29C 45/021; B29C 2045/2709; B29C 45/34
See application file for complete search history.

(56) References Cited

U.S. PATENT DOCUMENTS

| | | | | | |
|---|---|---|---|---|---|
| 4,513,942 | A | * | 4/1985 | Creasman | ......... B29C 45/14655 249/110 |
| 4,861,251 | A | * | 8/1989 | Moitzger | ................ B29C 33/18 425/116 |
| 5,077,237 | A | * | 12/1991 | Hara | ...................... H01L 21/565 264/272.17 |
| 5,405,255 | A | * | 4/1995 | Neu | .................. B29C 45/14655 249/91 |
| 5,409,362 | A | * | 4/1995 | Neu | .................. B29C 45/14655 425/116 |
| 5,578,261 | A | * | 11/1996 | Manzione | ......... B29C 45/14655 264/272.15 |
| 5,998,243 | A | * | 12/1999 | Odashima | ......... B29C 45/14655 438/127 |
| 6,267,577 | B1 | * | 7/2001 | Nishi | ...................... B29C 45/02 257/E21.504 |

(Continued)

*Primary Examiner* — Xiao S Zhao
*Assistant Examiner* — Emmanuel S Luk
(74) *Attorney, Agent, or Firm* — McClure, Qualey & Rodack, LLP

(57) ABSTRACT

A mold chase is provided, including a lower mold support and an upper mold support which are configured to be pressed together to form a mold cavity therebetween for receiving a wafer level substrate. The mold chase also includes multiple gates and at least one vent disposed along the periphery of the mold cavity. The gates are configured to allow a mold material to be injected into the mold cavity, and the vents are configured to release gas from the mold cavity. The distance between one of the gates and the closest vent is less than the diameter of the mold cavity.

20 Claims, 16 Drawing Sheets

(56) References Cited

U.S. PATENT DOCUMENTS

| | | | | |
|---|---|---|---|---|
| 6,676,885 | B2* | 1/2004 | Shimizu | B29C 45/14655 |
| | | | | 257/E21.504 |
| 6,867,487 | B2* | 3/2005 | Huang | H01L 21/565 |
| | | | | 257/687 |
| 10,262,879 | B2* | 4/2019 | Maeda | B29C 45/34 |
| 2003/0129272 | A1* | 7/2003 | Shen | B29C 45/14655 |
| | | | | 425/123 |
| 2007/0262423 | A1* | 11/2007 | Dimaano, Jr. | H01L 21/565 |
| | | | | 257/667 |
| 2009/0115098 | A1* | 5/2009 | De Vries | H01L 21/565 |
| | | | | 264/272.13 |
| 2009/0160084 | A1* | 6/2009 | Kuratomi | H01L 21/565 |
| | | | | 264/219 |
| 2010/0155110 | A1* | 6/2010 | Watanabe | H05K 3/284 |
| | | | | 174/255 |
| 2012/0018927 | A1* | 1/2012 | Watanabe | H01M 8/0284 |
| | | | | 264/500 |
| 2013/0161800 | A1* | 6/2013 | Byun | H01L 23/18 |
| | | | | 257/667 |
| 2013/0228951 | A1* | 9/2013 | Jang | H01L 25/50 |
| | | | | 264/272.14 |
| 2014/0291881 | A1* | 10/2014 | Jang | B29C 45/14655 |
| | | | | 264/102 |
| 2015/0364456 | A1* | 12/2015 | Yu | H01L 21/561 |
| | | | | 264/40.1 |
| 2016/0240396 | A1* | 8/2016 | Cheon | B29C 33/10 |
| 2017/0136669 | A1* | 5/2017 | Choi | B29C 45/14655 |
| 2017/0141050 | A1* | 5/2017 | Jang | H01L 23/562 |
| 2017/0263476 | A1* | 9/2017 | Maeda | B29C 45/34 |
| 2017/0271186 | A1* | 9/2017 | Maeda | B29C 45/34 |
| 2018/0254198 | A1* | 9/2018 | Maeda | H01L 21/565 |

\* cited by examiner

WAFER LEVEL MOLD CHASE

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are being designed to be even more compact and to support higher circuit density.

Flip chip packages or wafer level packages (WLPs) are ideally suited for ICs demanding high speed, high density, and a higher pin count. Flip chip packaging involves mounting the active side of the chip or die face down toward a carrier substrate or wafer substrate. The electrical and mechanical interconnect between the active devices on the die and conduction tracks on the carrier substrate is achieved through an interconnect structure comprising a large number of conductive bumps or balls. An encapsulant or mold material is provided around the die and in a gap between the die and the carrier substrate after the die is attached to the carrier substrate, so as to isolate the die from the external environment.

Although existing wafer level packaging (WLP) techniques have been adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1A:
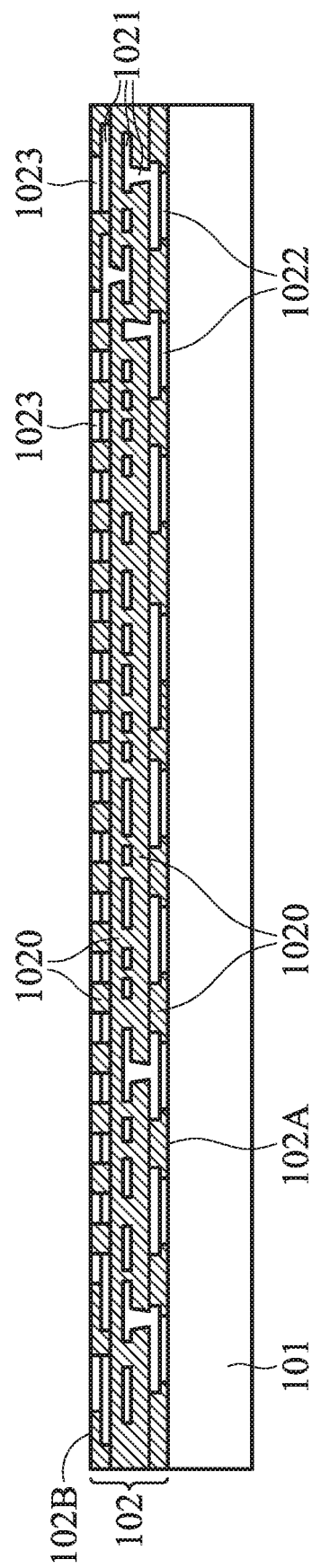
FIG. 1A is a schematic cross-sectional view illustrating an intermediate stage in a wafer level packaging process, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Although the terms "first", "second", "third", etc. may be used in the following detailed description to describe various elements, regions or sections, these elements, regions or sections should not be limited by these terms. These terms are only used to distinguish one element, region or section from another element, region or section. Thus, a first element, region or section discussed below could be termed a second element, region or section without departing from the teachings of the present invention.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The present disclosure is generally related to a mold chase used for molding (i.e., encapsulating the semiconductor chip or die with a mold material) during wafer level packaging (WLP) processes. The term "wafer level packaging (WLP)" used herein may mean that all packaging and interconnection are fabricated on the wafer substrate prior to dicing. Examples of a wafer level packaging process are provided herein for a better illustration of the concepts of the present disclosure, and are not intended to be limiting the present disclosure. More specifically, the present disclosure is related to a mold chase designed to reduce the formation of voids within the mold material during the molding process, which will be described in detail below. Thus, the demand for higher performance and reliability in the fabricated semiconductor packages can be achieved.

FIGS. 1A-1G are schematic cross-sectional views illustrating various stages in a wafer level packaging (WLP) process, in accordance with some embodiments. Some variations of the embodiments are described. It should be understood that the materials, geometries, structures, and processes described herein are only illustrative, and are not intended to be, and should not be constructed to be, limiting to the present disclosure. Many alternatives and modifications will be apparent to those skilled in the art, once informed by the present disclosure.

Referring to FIG. 1A, a low cost dummy substrate or carrier 101 is provided for structural support. In some embodiments, the dummy substrate 101 comprises temporary or sacrificial base material such as silicon, polymer, glass, beryllium oxide, a composite material with an appropriate coefficient of thermal expansion (CTE), or another suitable rigid material. The dummy substrate 101 is a temporary and sacrificial supporting wafer substrate (i.e., with wafer form), and is capable of withstanding processing temperatures equal to or greater than 200° C.

Next, a wafer level redistribution layer (RDL) or interconnect structure 102 is formed over the dummy substrate 101. In some embodiments, the redistribution layer 102 provides electrical connection between semiconductor chips or dies 104 (see FIG. 1C), as well as electrical connection to electrically conductive bumps 109 (see FIG. 1G), which is described in more detail below.

In some embodiments, as shown in FIG. 1A, the redistribution layer 102 may include passivation or insulating layers 1020, electrically conductive layers (or lines) 1021 formed between or in the insulating layers 1020, electrically conductive pads 1022 formed on (or exposed to) a first surface 102A (e.g., the shown bottom surface) of the redistribution layer 102 attached to the dummy substrate 101, and a number of electrically conductive pads 1023 formed on (or exposed to) a second surface 102B (e.g., the shown top surface) of the redistribution layer 102 opposite the first surface 102A. In various examples, each insulating layer 1020 can be deposited over the dummy substrate 101 or another insulating layer 1020 using chemical vapor deposition (CVD), physical vapor deposition (PVD), atomic layer deposition (ALD), spin-on coating, lamination, or another suitable deposition process, and/or each insulating layer 1020 can be patterned using a mask-defined etching process (e.g., including a lithography process and an etching process, such as a wet or dry etching process). Also, the conductive layers 1021 and the conductive pads 1022, 1023 electrically connected to the conductive layers 1021 can be formed between or in the insulating layers 1020 using any suitable deposition processes and/or mask-defined etching processes described above. The insulating layers 1020 may comprise polymer, polyimide, silicon oxide, silicon nitride, or another suitable insulating material. The conductive layers 1021 and the conductive pads 1022, 1023 may comprise Cu, Pt, Ag, Ni, another suitable metal, alloys thereof, a combination thereof, or another suitable electrically conductive material. In some embodiments, the redistribution layer 102 further includes active and/or passive components, such as transistors, filters, resistors, capacitors, inductors, or the like (not shown).

Figure 1B:
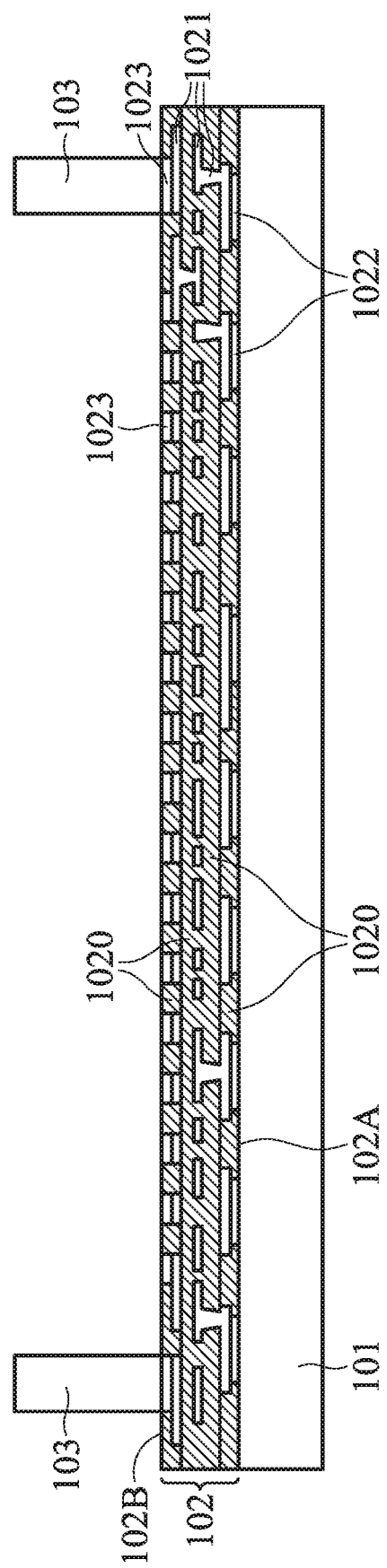
FIG. 1B is a schematic cross-sectional view illustrating an intermediate stage in a wafer level packaging process, in accordance with some embodiments.

Referring to FIG. 1B, a number of electrically conductive through vias 103 (i.e., metal pillars) are formed on the second surface 102B of the redistribution layer 102 and electrically connected to some conductive pads 1023. In some embodiments (see FIG. 1D), the through vias 103 provide electrical connection between the redistribution layer 102 and another redistribution layer 107 (hereinafter referred to as a second redistribution layer 107 for illustration), which is described in more detail below. In various examples, the through vias 103 can be formed, for example, by depositing an insulating layer over the redistribution layer 102 through any suitable deposition process, patterning the insulating layer through a mask-defined etching process to form a number of openings corresponding to some conductive pads 1023, forming metal features (i.e., metal pillars) in the openings through plating (e.g., electro plating or electro-less plating), and removing the remaining insulating layer through any suitable etching process. The through vias 103 may comprise Cu, Pt, Ag, Ni, another suitable metal, alloys thereof, or a combination thereof.

Figure 1C:
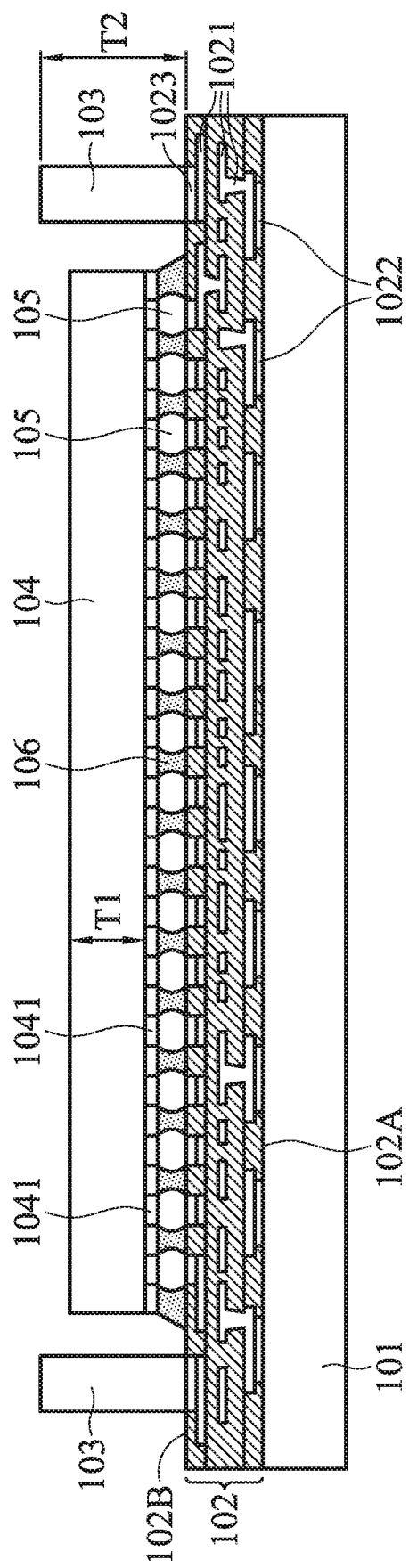
FIG. 1C is a schematic cross-sectional view illustrating an intermediate stage in a wafer level packaging process, in accordance with some embodiments.

Referring to FIG. 1C, a number of semiconductor chips or dies 104 (only one semiconductor chip 104 is depicted for simplicity) are mounted on the redistribution layer 102 by flip chip bonding. For example, each semiconductor chip 104 has contact pads 1041 formed on its active surface (e.g., the shown bottom surface), and electrically conductive bumps or balls 105 (e.g., a ball grid array (BGA)) containing lead free solder or the like are formed on the contact pads 1041. Next, the semiconductor chip 104 is placed so that the conductive bumps 105 are in contact with some conductive pads 1023 on the second surface 102B of the redistribution layer 102. Then, the conductive bumps 105 are reflowed to improve the electrical and mechanical connection between the contact pads 1041, the conductive bumps 105, and the conductive pads 1023. In various examples, the semiconductor chips 104 can be any suitable integrated circuit (IC) chips or dies for a particular application, such as memory chips, logic chips, processor chips, or the like. In some exemplary embodiments, the thickness T1 of the semiconductor chip 104 is smaller than the thickness T2 of the through vias 103, as shown in FIG. 1C.

While the semiconductor chips 104 are mounted on the redistribution layer 102 after the formation of the through vias 103 as shown in FIG. 1C, the semiconductor chips 104 may also be mounted on the redistribution layer 102 prior to the formation of the through vias 103 in some other embodiments.

In some embodiments, after the semiconductor chips 104 are flip chip bonded to the redistribution layer 102, an underfill material 106 in a liquid state is further dispensed (e.g., by a dispenser or nozzle (not shown)) into the space between each semiconductor chip 104 and the redistribution layer 102 and the space between adjacent conductive bumps 105. Then, it can be cured by any suitable means. The applied underfill material 106 provides a stronger mechanical connection and a heat bridge between the semiconductor chip 104 and the redistribution layer 102, reduces cracking in the conductive bumps 105 caused by thermal expansion mismatches between the semiconductor chip 104 and the redistribution layer 102, and protects the joints from contaminants. The underfill material 106 may comprise liquid epoxy, deformable gel, silicon rubber, or the like. In some alternative embodiments, the application of the underfill material 106 can also be omitted.

Figure 1D:
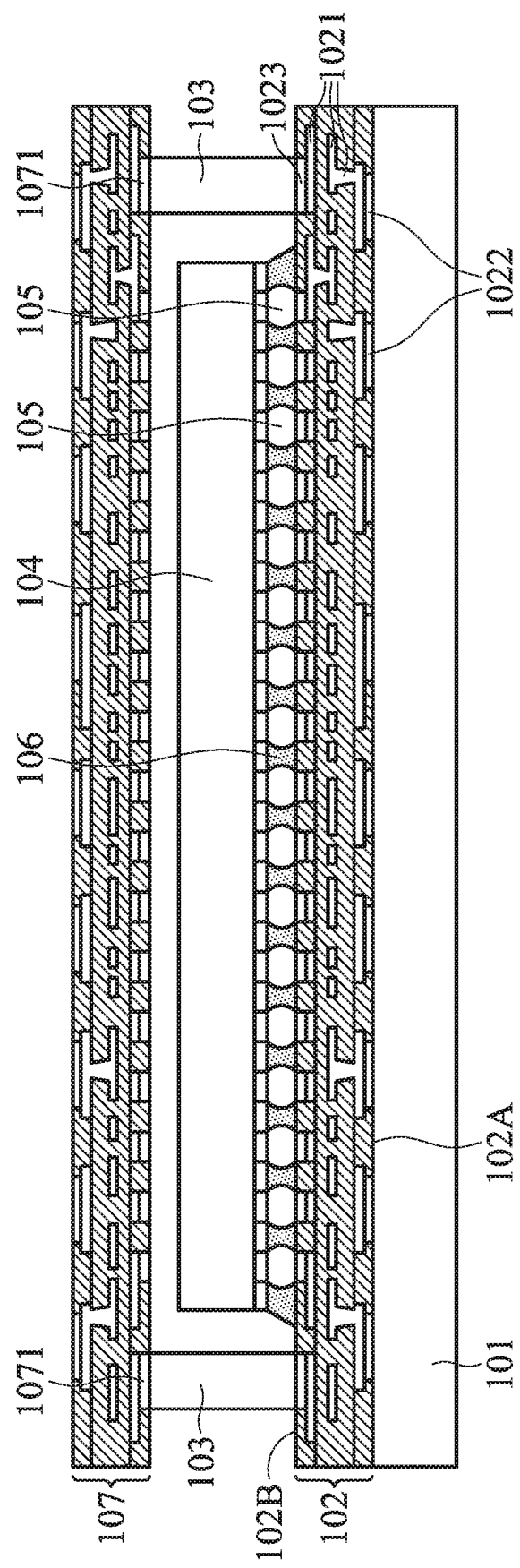
FIG. 1D is a schematic cross-sectional view illustrating an intermediate stage in a wafer level packaging process, in accordance with some embodiments.

Referring to FIG. 1D, in some embodiments, a second redistribution layer 107 having a similar structure to the redistribution layer 102 (i.e., the second redistribution layer 107 may also include insulating layers, electrically conductive layers or lines formed between or in the insulating layers, and electrically conductive pads formed on the top and bottom surfaces of the second redistribution layer 107) is provided. The materials and processes used for forming the second redistribution layer 107 are similar to those for the redistribution layer 102, and thus are not repeated here. Next, the second redistribution layer 107 is electrically connected to the redistribution layer 102 through the through vias 103. For example, electrically conductive bumps (not shown) can be formed between the top of the through vias 103 and some conductive pads 1071 formed on the bottom surface of the second redistribution layer 107. Then, the conductive bumps can be reflowed to improve the electrical and mechanical connection between the conductive pads 1071, the conductive bumps, and the through vias 103. The second redistribution layer 107 may provide the fabricated semiconductor package 100 (see FIG. 1G) with an electrical interface to external circuitry (not shown). In some alternative embodiments, the second redistribution layer 107, as well as the through vias 103, can also be omitted.

Figure 1E:
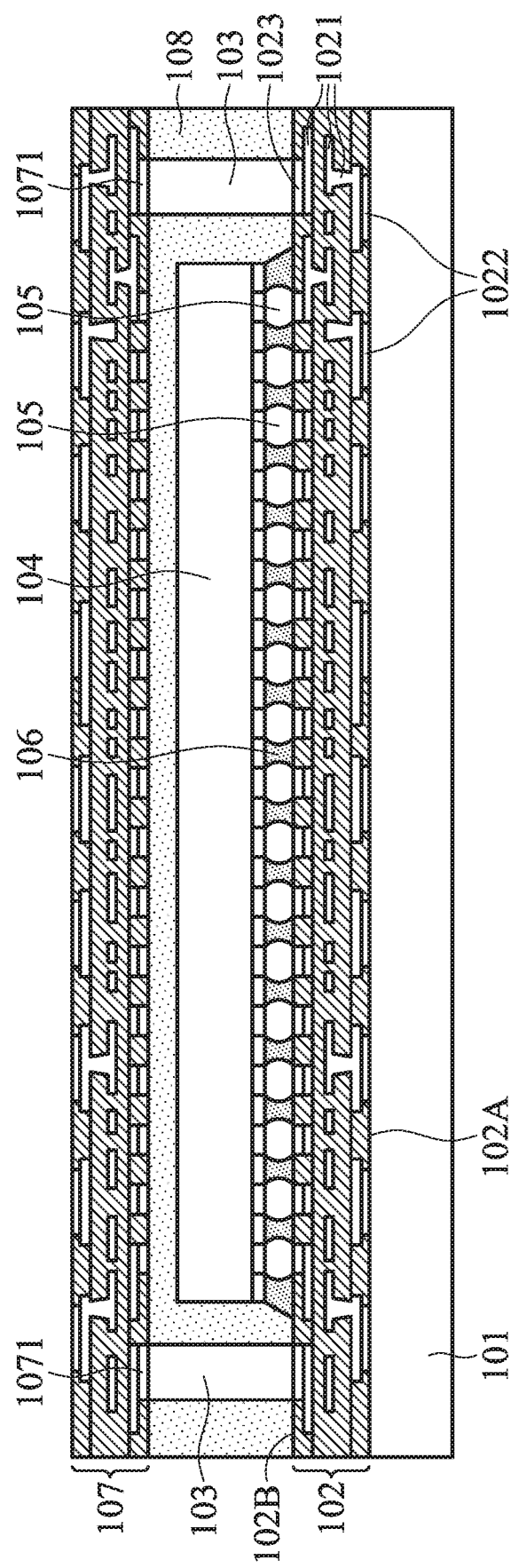
FIG. 1E is a schematic cross-sectional view illustrating an intermediate stage in a wafer level packaging process, in accordance with some embodiments.

Referring to FIG. 1E, a molding process is performed, in which an encapsulant or mold material 108 is injected into the space between the redistribution layer 102 and the second redistribution layer 107, the space between each semiconductor chip 104 and the second redistribution layer 107, and the space between each semiconductor chip 104 and the adjacent through vias 103, by injection compression molding (which is described in more detail below), in some embodiments. Then, the mold material 108 can be cured by any suitable means. The applied mold material 108 provides package stiffness, a protective or hermetic shielding, and/or provides a heat conductive path to prevent chip overheating. In some embodiments, the mold material 108 layer may be between 10 µm and 500 µm thick, depending on the application, the chips or dies on the wafer substrate, and the material selected for the molding process. The mold material 108 may comprise epoxy, epoxy with thermally conductive filler materials, plastic molding compound, or another suitable material.

Figure 2:
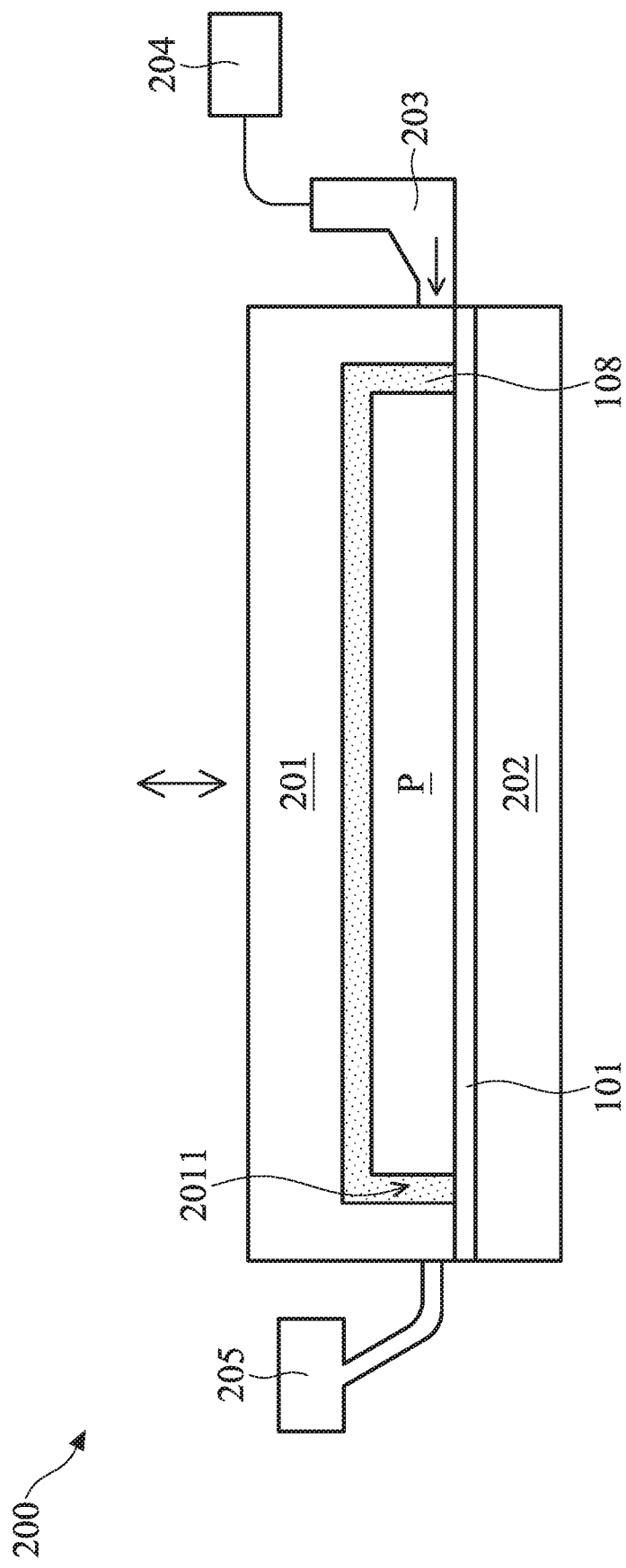
FIG. 2 is a schematic view illustrating a molding process performed using a mold chase.

FIG. 2 is a schematic view illustrating a molding process performed using a mold chase 200 including an upper mold support 201 and a lower mold support 202. It should be understood that in FIG. 2 the details of the package structure that is to be subjected to the molding process have been simplified, for example, a package unit P attached to the dummy substrate 101 may represent the combination of the redistribution layer 102, second redistribution layer 107, semiconductor chips 104, and through vias 103 shown in FIG. 1D. As indicated by the two way vertical arrow in FIG. 2, the upper and lower mold supports 201 and 202 can open (e.g., the upper mold support 201 can be moved away from the lower mold support 202) and close (e.g., the upper mold support 201 can be moved close to the lower mold support 202) for loading and unloading of the package structure (open for these steps), and for molding and curing (close for these steps).

As shown in FIG. 2, during the molding process, the upper and lower mold supports 201 and 202 are pressed together (e.g., by a pressure supply device; not shown) to enclose the package unit P and the dummy substrate 101 with an open space 2011 over the dummy substrate 101 and between the spaces (not shown for simplicity) of the package unit P. A mold material 108 in a liquid state is injected into one side of the mold chase 200 with a nozzle 203 that is in fluid communication with a source 204 of the mold material (e.g., an injection compression molding device that can convert the mold material 108 that was originally in a power or solid state into a liquid state and deliver it to the nozzle 203, in a particular example) while a vacuum pump 205 draws gas or pressure from an opposite side of the mold chase 200. Accordingly, the space between the redistribution layer 102 and the second redistribution layer 107, the space between each semiconductor chip 104 and the second redistribution layer 107, and the space between each semiconductor chip 104 and the adjacent through vias 103 (of the package unit P) are filled with the mold material 108, as shown in FIG. 1E.

Figure 3:
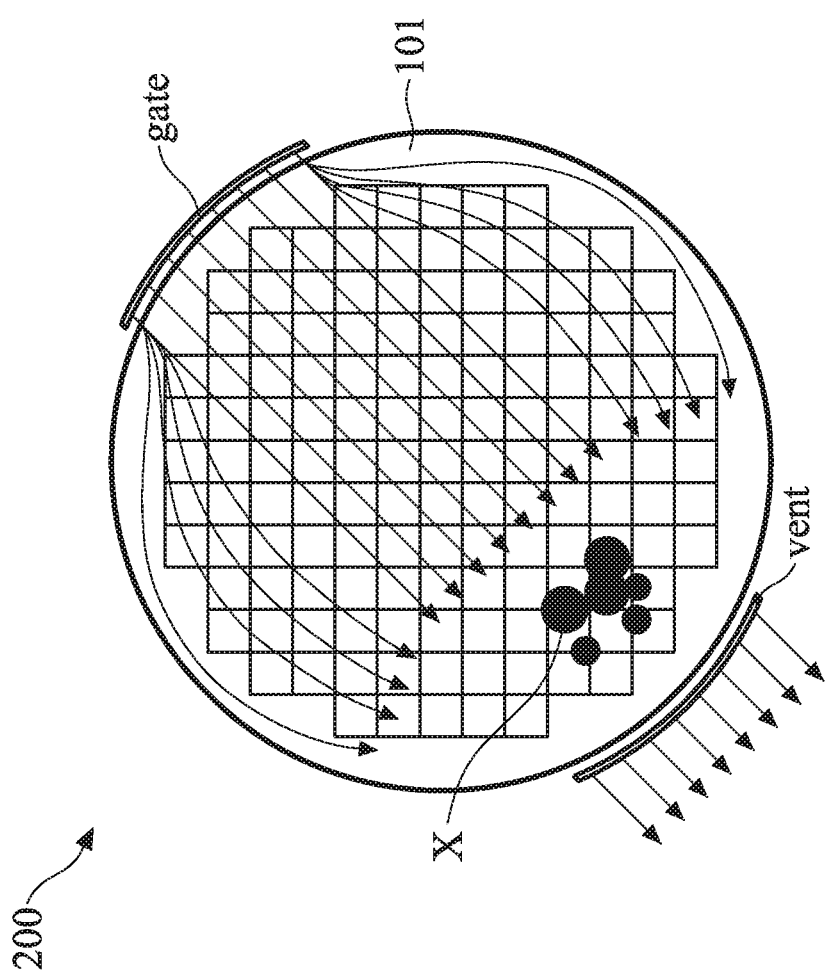
FIG. 3 is a schematic view illustrating that voids or bubbles can easily be trapped near the vent side of the mold chase.

However, it has been observed that voids or bubbles X can easily be trapped near the vent side (i.e., the side close to the vacuum pump 205) of the mold chase 200 when the mold material 108 is injected into the open space 2011 (see FIG. 2) through one gate of the mold chase 200 and gas or pressure in the mold chase 200 is released through one vent of the mold chase 200 during the molding process, as shown in FIG. 3 (note that the lines emitting from the gate and the vent in FIG. 3 may represent the flow of the mold material 108). This is because the distance between the gate and the vent formed on opposite sides of the mold chase 200 is too long, e.g., equal to or greater than the diameter of the open space 201. Voids X formed within the mold material 108 can adversely affect the performance (e.g., thermal and mechanical performance) and the reliability of the fabricated semiconductor package 100 (see FIG. 1G). Embodiments of a wafer level mold chase are provided below to reduce the formation of voids during the molding process.

Figure 4:
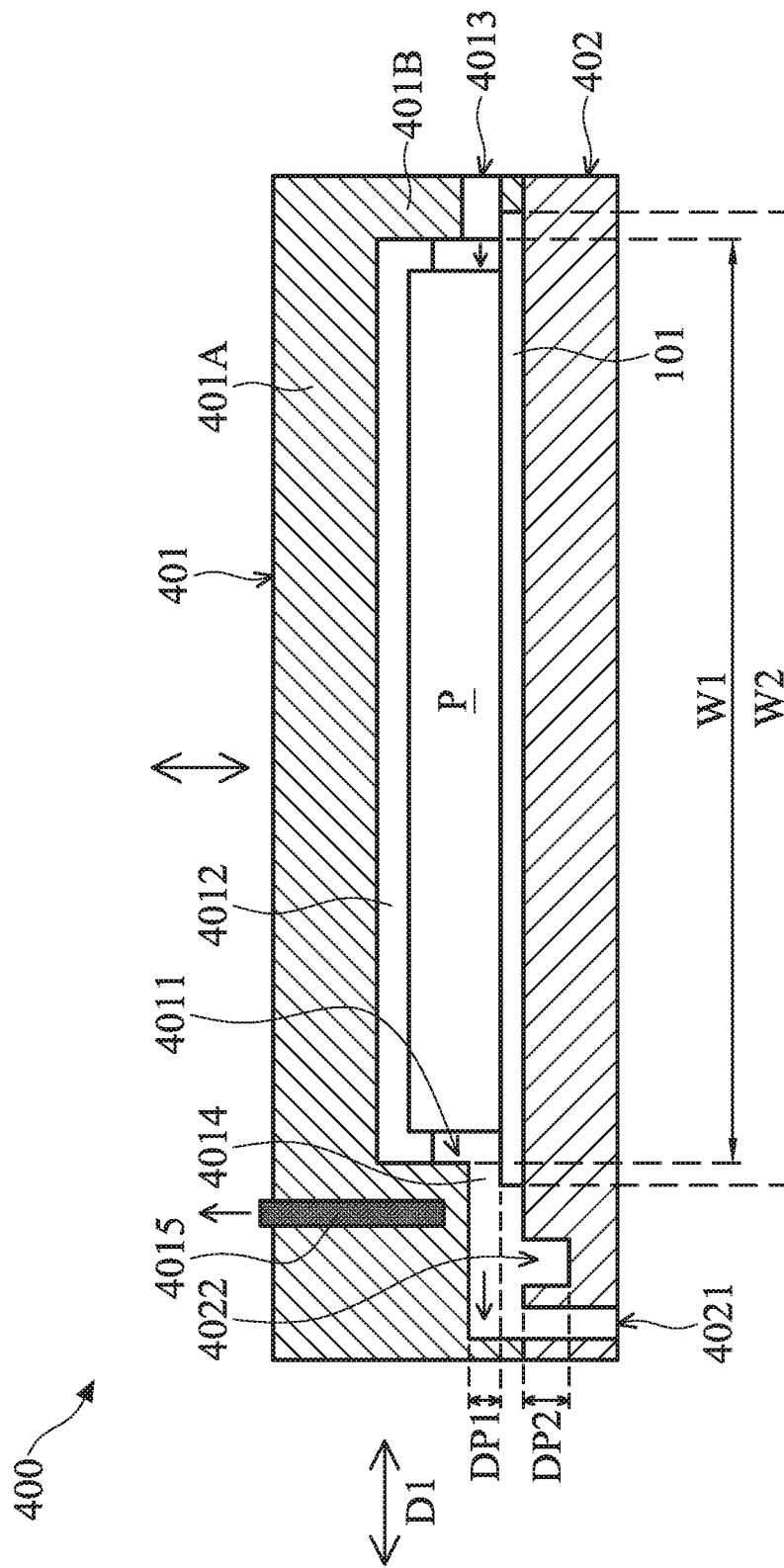
FIG. 4 is a schematic cross-sectional view of a mold chase, in accordance with some embodiments.

FIG. 4 is a schematic cross-sectional of a mold chase 400, in accordance with some embodiments. In some embodiments, the mold chase 400 includes an upper mold support 401 and a lower mold support 402. It should be appreciated that the features described below can be replaced or eliminated in other embodiments of the mold chase.

In some embodiments, both the upper and lower mold supports 401 and 402 are substantially rectangular plate structures in top view, and their long sides may be parallel to the direction D1 shown in FIG. 4. Moreover, the upper mold support 401 includes a top wall 401A and a sidewall 401B extending downward from the periphery of the top wall 401A, forming a mold cavity 4011 on the lower surface of the upper mold support 401. Similar to FIG. 2 described above, the upper and lower mold supports 401 and 402 can open (e.g., the upper mold support 401 can be moved away from the lower mold support 402) and close (e.g., the upper mold support 401 can be moved close to the lower mold support 402) for loading and unloading of the package structure (open for these steps), and for molding and curing (close for these steps).

As shown in FIG. 4, during the molding process, the upper and lower mold supports 401 and 402 are pressed together to form an open space (i.e., the mold cavity 4011) therebetween for receiving a package structure (e.g., a dummy substrate 101 and a package unit P attached thereon, described above). The shape of the mold cavity 4011 corresponds to the shape of the package structure or the dummy substrate 101. In some embodiments, the width W1 of the mold cavity 4011 is slightly smaller than the width W2 of the dummy substrate 101, as shown in FIG. 4. Therefore, the periphery of the dummy substrate 101 can be covered and pressed by the sidewall 401B of the upper mold support 401 surrounding the mold cavity 4011 when the upper and lower mold supports 401 and 402 are brought together, so as to form a sealed mold space (i.e., the mold cavity 4011) over the dummy substrate 101 and the package unit P.

In some embodiments, as shown in FIG. 4, a compressible releasing film 4012 is also placed in the mold cavity 4011 (e.g., attached to the bottom of the mold cavity 4011). The compressible releasing film 4012 may conform to the back surface (i.e., the shown top surface) and a portion of the side surfaces of the package unit P to prevent formation of the mold material 108 (not shown in FIG. 4) on these surfaces. In some alternative embodiments, the compressible releasing film 4012 can also be omitted.

In some embodiments, more than one gates 4013 (for example, see FIG. 5 and FIG. 6) are formed or disposed on the sidewall 401B of the upper mold support 401 and arranged around the periphery of the mold cavity 4011 so as to allow the mold material 108 to be injected into the mold cavity 4011 (as indicated by the horizontal arrow near the gate 4013 in FIG. 4) through the source 204 of the mold material 108 and the nozzles 203 described above. Moreover, one or more vents 4021 (for example, see FIG. 5 and FIG. 6) are formed or disposed on the lower mold support 402 below the sidewall 401B of the upper mold support 401 (and located at a certain distance from the dummy substrate 101) and arranged around the periphery of the mold cavity 4011 so as to release or draw gas or pressure (as indicated by the horizontal arrow near the vent 4021 in FIG. 4) from the mold cavity 4011 through the vacuum pump 205 described above. It should be understood that the vent(s) 4021 can also be formed or disposed at any suitable location (s) of the lower mold support 402 or the upper mold support 401 in different embodiments, and should not be limited to the configuration shown in FIG. 4.

Figure 5:
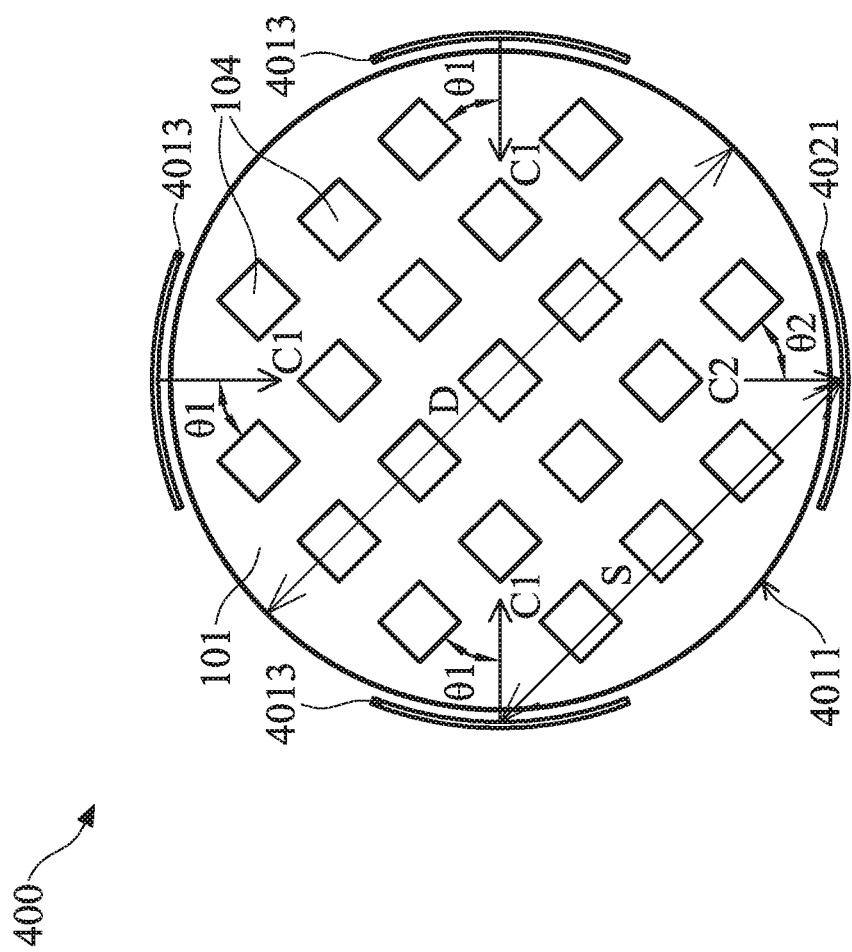
FIG. 5 is a schematic top view of a mold chase in accordance with some embodiments, illustrating the arrangement of three gates and one vent of the mold chase.

FIG. 5 is a schematic top view of the mold chase 400 in accordance with some embodiments. For simplicity and clarity, only the gates 4013 and the vent 4021 of the mold chase 400 and the peripheral sidewall of the mold cavity 4011 are depicted in FIG. 5. In some embodiments, as shown in FIG. 5, the mold chase 400 includes three gates 4013 and one vent 4021. The gates 4013 and the vent 4021 are arranged at equal intervals around the mold cavity 4011. Moreover, one of the gates 4013 and the vent 4021 are located on opposite sides of the mold cavity 4011. Therefore, the distance S between (the center of) the vent 4021 and (the center of) the gate 4013 that is not disposed opposite the vent 4021 can be less than the diameter D of the mold cavity 4011, as shown in FIG. 5.

With the arrangement of the gates 4013 and the vent 4021 of the mold chase 400 (FIG. 5) described above, the formation of voids during the molding process is reduced or eliminated because the distance between the vent 4021 and the closest gate 4013 is shorten so that voids or bubbles in the mold cavity 4011 can be smoothly removed or discharged through the vent 4021.

Figure 6:
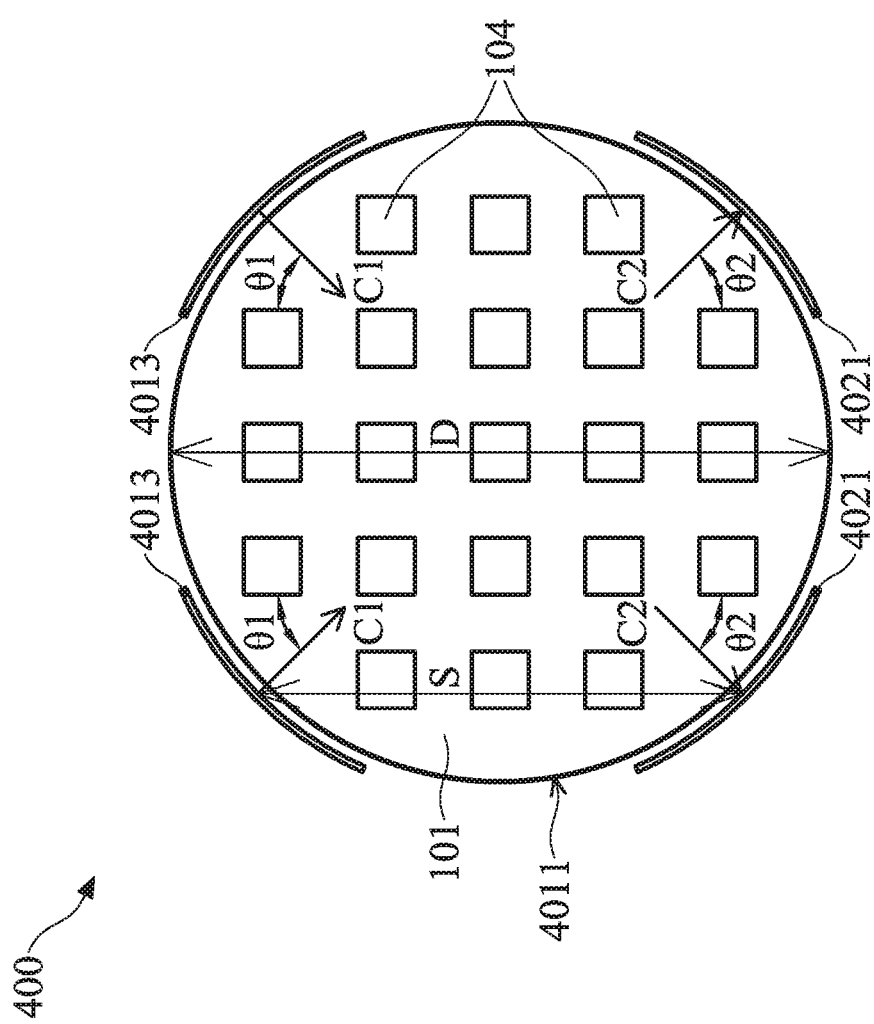
FIG. 6 is a schematic top view of a mold chase in accordance with some embodiments, illustrating the arrangement of two gates and two vents of the mold chase.

FIG. 6 is a schematic top view of the mold chase 400 in accordance with some other embodiments. For simplicity and clarity, only the gates 4013 and the vents 4021 of the mold chase 400 and the peripheral sidewall of the mold cavity 4011 are depicted in FIG. 6. In some embodiments, as shown in FIG. 6, the mold chase 400 includes two gates 4013 and two vents 4021. The gates 4013 and the vents 4021 are arranged at equal intervals around the mold cavity 4011. Moreover, one of the gates 4013 and one of the vents 4021 are located on opposite sides of the mold cavity 4011. Therefore, the distance S between (the center of) one of the vents 4021 and (the center of) the closest gate 4013 can be less than the diameter D of the mold cavity 4011.

Similarly, with the arrangement of the gates 4013 and the vents 4021 of the mold chase 400 (FIG. 6) described above, the formation of voids during the molding process is reduced or eliminated because the distance between each of the vents 4021 and the closest gate 4013 is shorten so that voids or bubbles in the mold cavity 4011 can be smoothly removed or discharged through the vents 4021.

In some embodiments, as shown in FIG. 5 or FIG. 6, the gates 4013 can be further configured so that the mold material 108 is injected through each of the gates 4013 into the mold cavity 4011 along a central line C1 (i.e., the main flow line), and an angle θ1 of about 45 degrees (e.g., between 35 degrees and 55 degrees) is formed between the central line C1 and the edge of each chip (i.e. the semiconductor chip 104) attached to the dummy substrate 101. Moreover, the vent(s) 4021 can further be configured so that gas or pressure in the mold cavity 4011 is released or discharged through each of the vents 4021 along a central line C2 (i.e., the main flow line), and an angle θ 2 of about 45 degrees (e.g., between 35 degrees and 55 degrees) is formed between the central line C2 and the edge of each chip (i.e. the semiconductor chip 104) attached to the dummy substrate 101. Accordingly, the mold material 108 can flow more smoothly and be uniformly filled in the gap between adjacent semiconductor chips 104 during molding.

It should be appreciated that the configuration of the mold chase 400 in FIG. 5 and FIG. 6 are merely illustrative, and the number and the location of the gates 4013 and the vents 4021 can also vary in different embodiments as long as the distance between the vent(s) 4021 and the gate(s) 4013 is shorten so that voids or bubbles in the mold cavity 4011 can be smoothly removed or discharged through the vent(s) 4021.

Figure 7:
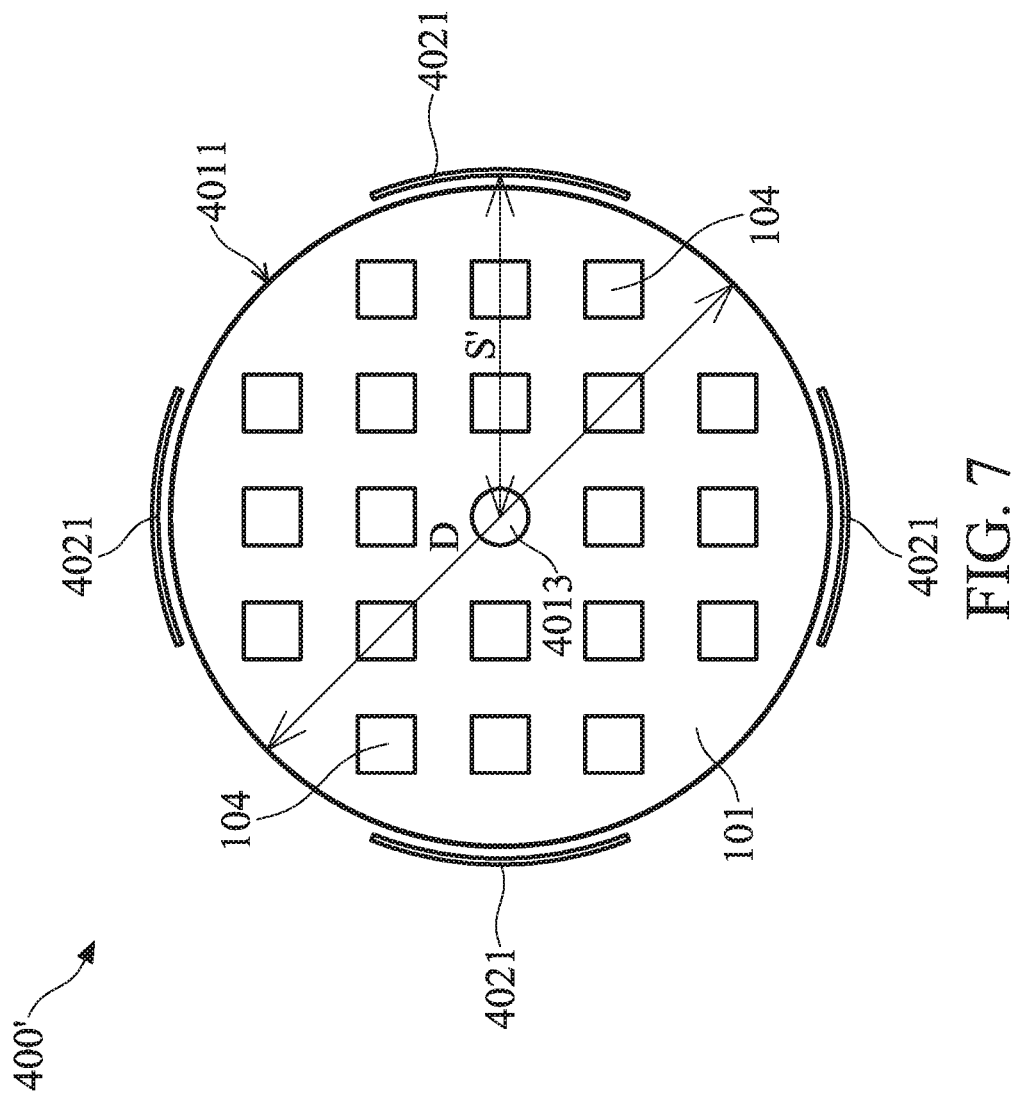
FIG. 7 is a schematic top view of a mold chase in accordance with some embodiments, illustrating the arrangement of one gate and four vents of the mold chase.

For example, in some alternative embodiments (as shown in FIG. 7), the mold chase 400' includes one gate 4013 formed or disposed on the top wall 401A of the upper mold support 401 instead of being disposed on the sidewall 401B of the upper mold support 401. The gate 4013 is formed in a central region of the upper mold support 401 (it is not depicted in FIG. 7 for simplicity and clarity). Moreover, the mold chase 400' includes a number of vents 4021 disposed or formed on the lower mold support 402 (it is not depicted in FIG. 7 for simplicity and clarity) and arranged at equal intervals around the mold cavity 4011. Accordingly, the distance S' between (the center of) the gate 4013 and (the center of) each of the vents 4021 can be less than the diameter D of the mold cavity 4011 (i.e., the distance S' is shorten), thereby facilitating the rapid and successful removal of voids or bubbles through the vents 4021. In some embodiments, the distance S' can be equal to or less than the radius of the wafer level substrate (i.e., the dummy substrate 101), as shown in FIG. 7.

Figure 8:
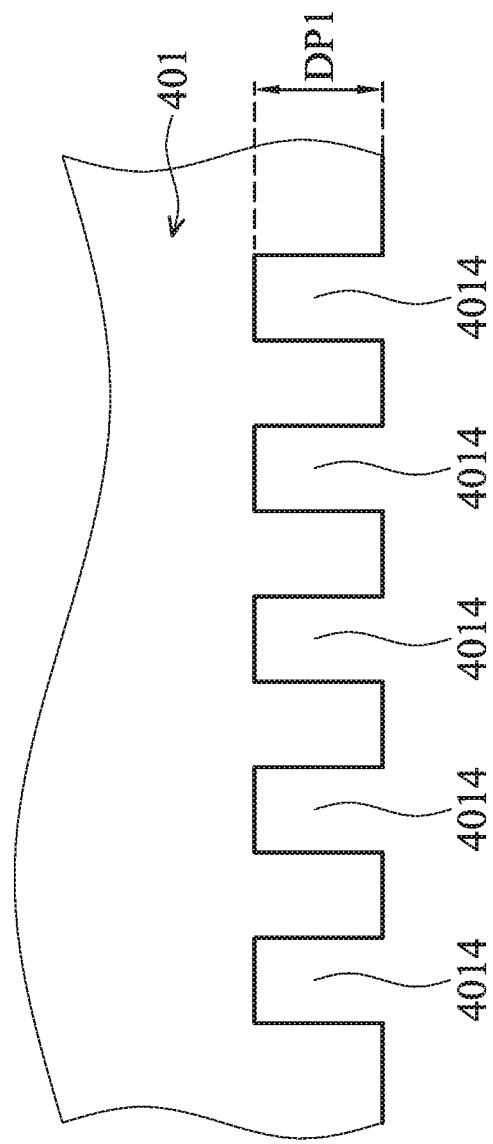
FIG. 8 schematically illustrates the cross section of the trenches in FIG. 4 when viewed from another viewing angle.

Referring back to FIG. 4, the mold chase 400 further includes a number of long trenches 4014 (the cross section when viewed in the direction D1 is shown in FIG. 8) formed on (the bottom surface of the sidewall 401B of) the upper mold support 401, arranged along the periphery of the mold cavity 4011, and corresponding to each of the vents 4021 (see also FIG. 9), in some embodiments. The trenches 4014 are configured to communicate the mold cavity 401 with the respective vent 4021 to allow gas or pressure in the mold cavity 4011 to be discharged through the vent 4021. In some embodiments (see also FIG. 10), the depth DP1 of each of the trenches 4014 is sufficient to allow the mold material 108 to pass, which is described in more detail below.

Figure 10:
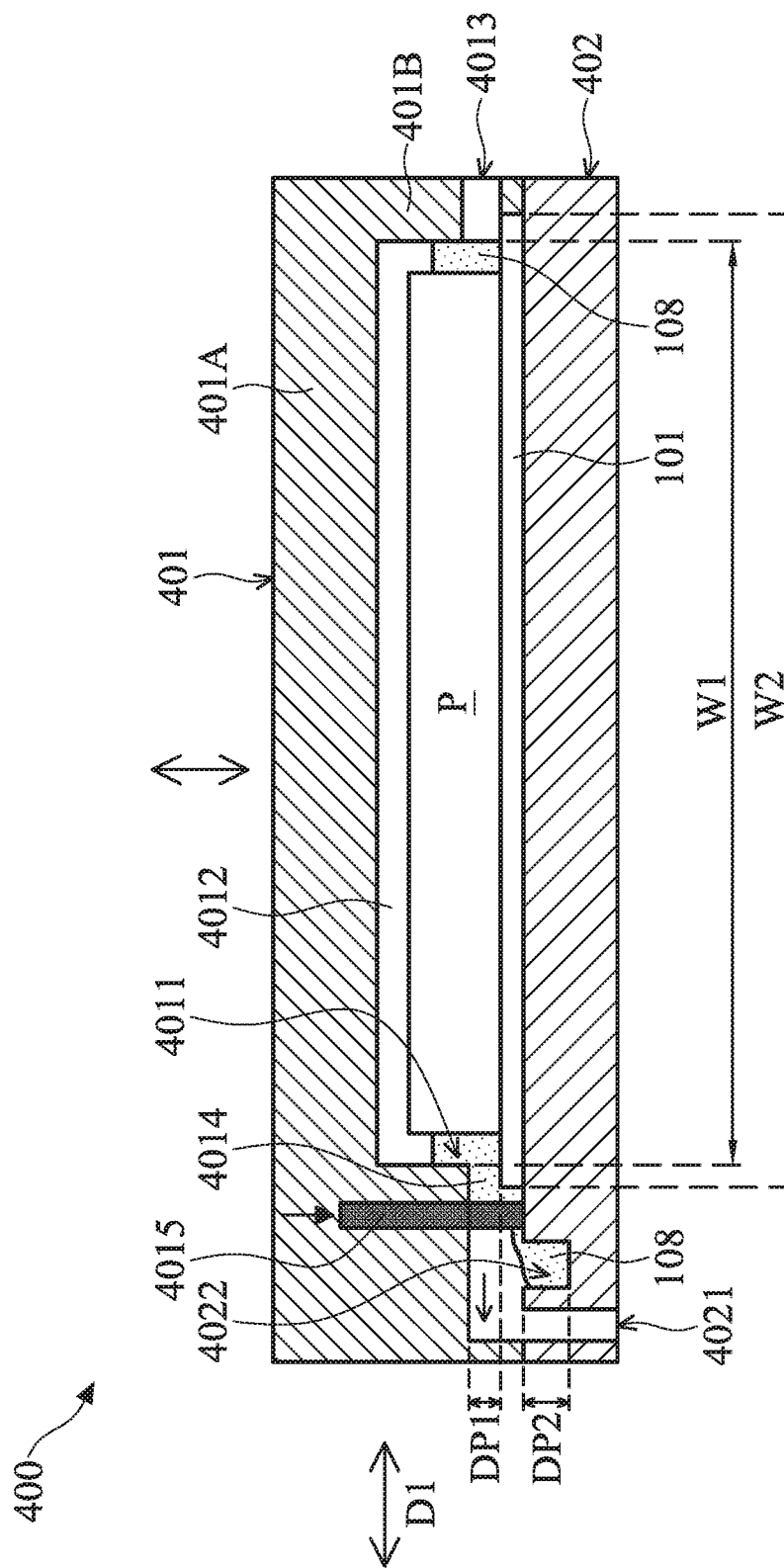
FIG. 10 is a schematic cross-sectional view illustrating that the storage tank collects the excessive mold material from the mold cavity.

In some embodiments, a shutter pin 4015 (e.g., a slit valve) is installed on or coupled to the upper mold support 401 and is operable to control the opening and closing of the trenches 4014 (of each vent 4021). For example, when the shutter pin 4015 is raised and does not pass through the trenches 4014 as shown in FIG. 4, the trenches 4014 are open to allow gas or pressure in the mold cavity 4011 to be discharged through the respective vent 4021, during the molding process. When the shutter pin 4015 is lowered to pass through the trenches 4014 and contact the upper surface of the lower mold support 402 as shown in FIG. 10, the trenches 4014 are closed to stop continuing to exhaust through the respective vent 4021, after the molding process is completed.

Figure 9:
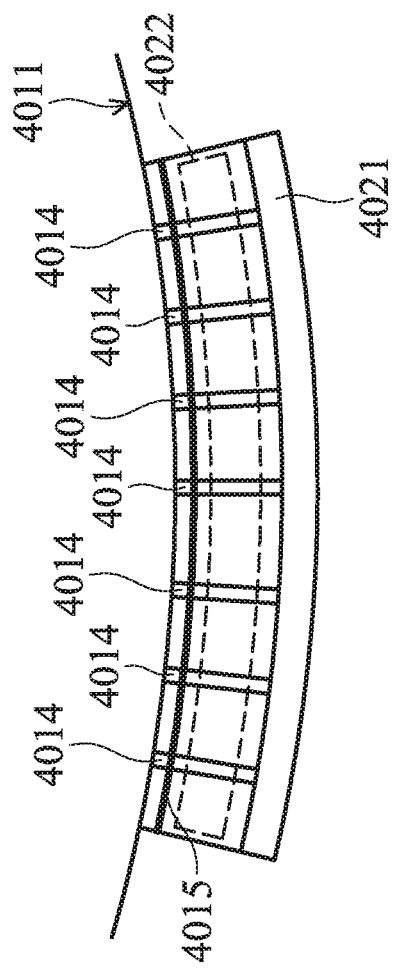
FIG. 9 is a schematic top view illustrating the configuration of the trenches, shutter pin, storage tank, and the vent, in accordance with some embodiments.

In some embodiments, the mold chase 400 further includes a number of storage tanks 4022 formed on the lower mold support 402 and disposed adjacent to the vents 4021, respectively (i.e., each vent 4021 corresponding to one storage tank 4022), as shown in FIG. 4. FIG. 9 is a schematic top view illustrating the configuration of the trenches 4014, shutter pin 4015, storage tank 4022, and the vent 4021, in accordance with some embodiments. In FIG. 9, the storage tank 4022 is disposed around the mold cavity 4011 and between the shutter pin 4015 and the vent 4021 (see also FIG. 10). In some embodiments, the storage tank 4022 is curved to correspond to the peripheral sidewall of the mold cavity 4011, as shown in FIG. 9.

It should be appreciated that the storage tanks 4022 are configured to collect the excessive mold material 108 from the mold cavity 4011 so as to further reduce or eliminate the formation of voids or bubbles during the molding process. More specifically, with the configuration of the storage tanks 4022, it allows the mold material 108 to be pressed to fill the entire mold cavity 4011 and flow through the trenches 4014, and then to be collected by the storage tanks 4022, as shown in FIG. 10. Accordingly, voids or bubbles can be successfully discharged from the mold cavity 4011 along with the mold material 108. In some embodiments, the depth DP2 of each storage tank 4022 is sufficient (e.g., several times of the depth DP1 of each trench 4014) to collect a certain amount of the mold material 108. After the storage tank 4022 is full, the respective shutter pin 4015 may be controlled (e.g., by a controller; not shown) to close the trenches 4014 to prevent the mold material 108 from continuing to flow out of the mold cavity 4011.

Figure 1F:
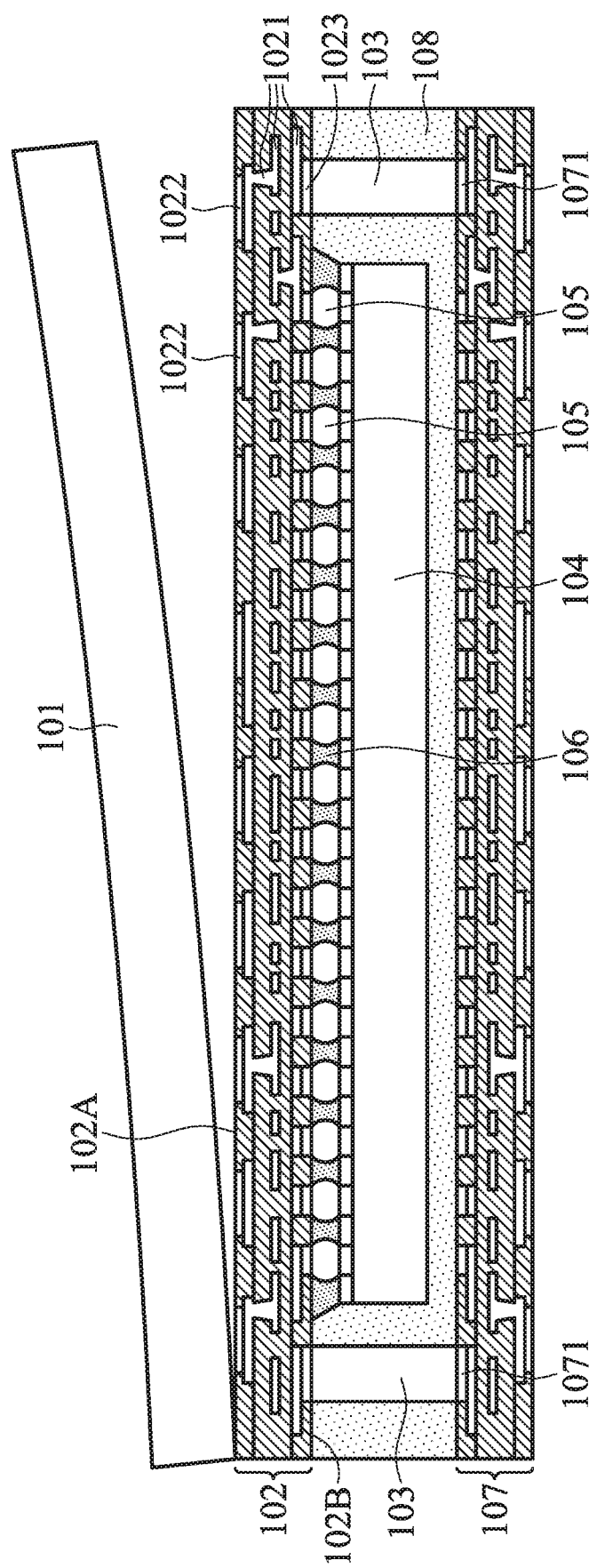
FIG. 1F is a schematic cross-sectional view illustrating an intermediate stage in a wafer level packaging process, in accordance with some embodiments.
Figure 1G:
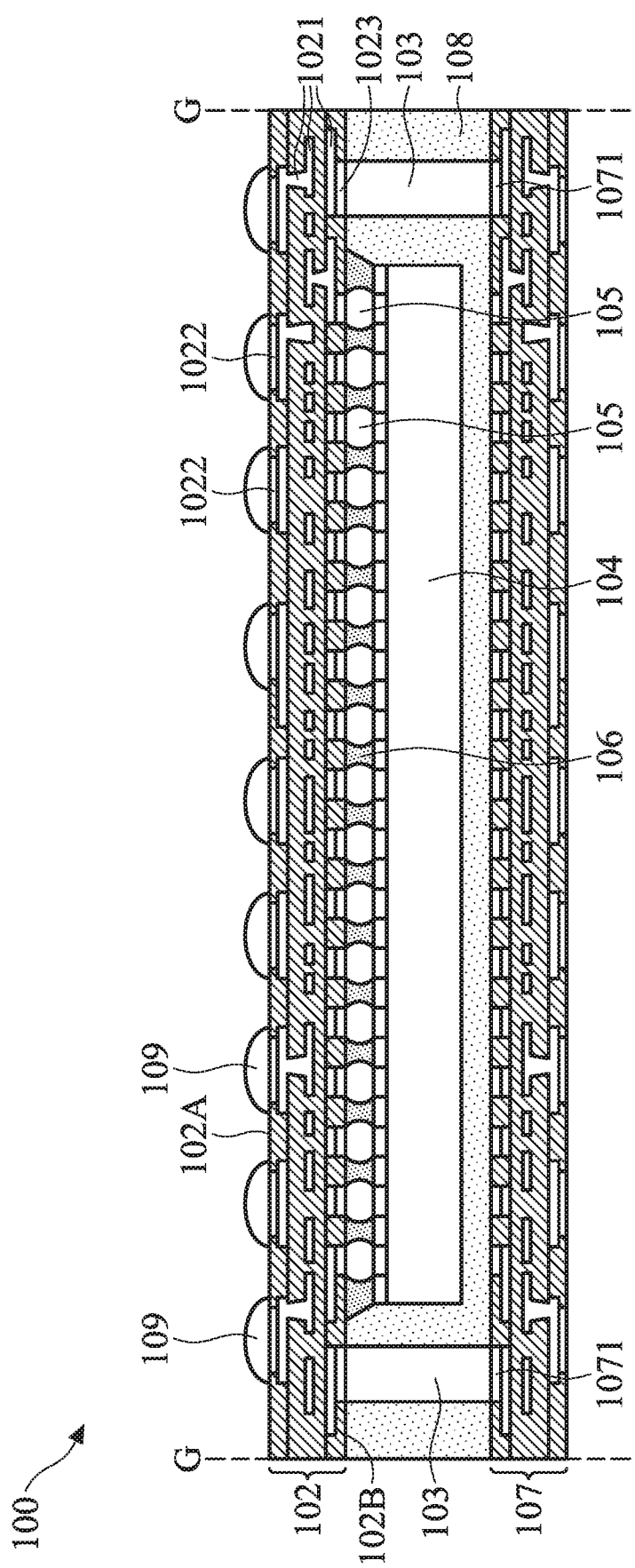
FIG. 1G is a schematic cross-sectional view illustrating an intermediate stage in a wafer level packaging process, in accordance with some embodiments.

With the above configurations, the formation of voids or bubbles (within the mold material 108) during the molding process is reduced, thereby improving the performance (e.g., thermal and mechanical performance) and the reliability of the fabricated semiconductor package 100 (see FIG. 1G). It should be understood that a storage tank 4022 can also be applied to a mold chase having only one gate and only one vent (formed on opposite sides of the mold cavity) to improve the void issue during molding.

Next, referring to FIG. 1F, after the molding process described above is completed, the resulting package structure of FIG. 1E is placed so that the dummy substrate 101 side faces up, and then the dummy substrate 101 is detached from the redistribution layer 102. In some embodiments, a sacrificial layer (not shown) is pre-formed between the dummy substrate 101 and the redistribution layer 102. When the sacrificial layer is removed by any suitable means (e.g., an etching or a cutting process), the dummy substrate 101 can be detached from the redistribution layer 102.

Afterwards, referring to FIG. 1G, a number of electrically conductive bumps or balls 109, such as BGA, are formed on the exposed first surface 102A of the redistribution layer 102 to electrically connect the electrically conductive pads 1022. The conductive bumps 109 may be configured to provide the fabricated semiconductor package 100 with an electrical interface to an external device, such as a printed circuit board (PCB; not shown). In some embodiments, the conductive bumps 109 comprise lead-free solder or the like.

In some embodiments, after the conductive bumps 109 are formed, a singulation or a sawing process is further performed, in which the redistribution layer 102, mold material 108, and the second redistribution layer 107 are die cut or diced along cutting lines or grooves G (depicted by dashed lines) in FIG. 1G to separate the package structure of the redistribution layer 102, second redistribution layer 107, semiconductor chip 104, mold material 108, and the through vias 103 into individual units. Thus, the fabrication of a semiconductor package 100 (utilizing a wafer level packaging process) is completed.

The embodiments of the present disclosure have some advantageous features: the provided wafer level mold chase for performing the mold process includes more than one gates so that the distance between the vent and the closest gate is shorten, thereby smoothly removing or discharging voids or bubbles formed near the vent side of the mold cavity. Additionally or alternatively, a storage tank is further formed between the vent and the trenches of the mold chase to collect the excessive mold material from the mold cavity. Accordingly, voids or bubbles formed during molding can also be successfully discharged from the mold cavity along with the mold material. As a result, the void issue of the mold process is improved, and the performance (e.g., thermal and mechanical performance) and the reliability of the fabricated semiconductor package are also improved.

In some embodiments, a mold chase is provided, including a lower mold support, an upper mold chase, a number of gates, and at least one vent. The upper mold support and the lower mold support are configured to be pressed together to form a mold cavity therebetween for receiving a wafer level substrate. The gates are disposed along the periphery of the mold cavity and configured to allow a mold material to be injected into the mold cavity. The vents are disposed along the periphery of the mold cavity and configured to release gas from the mold cavity. The distance between one of the gates and the closest vent is less than the diameter of the mold cavity.

In some embodiments, a mold chase is provided, including a lower mold support, an upper mold chase, a gate, and a number of vents. The upper mold support and the lower mold support are configured to be pressed together to form a mold cavity therebetween for receiving a wafer level substrate. The gate is formed in a central region of the upper mold support and configured to allow a mold material to be injected into the mold cavity. The vents are disposed along the periphery of the mold cavity and configured to release gas from the mold cavity. The distance between the gate and each of the vents is less than the diameter of the mold cavity.

In some embodiments, a mold chase is provided, including a lower mold support, an upper mold chase, a gate, a vent, a number of trenches, a shutter pin, and a storage tank. The upper mold support and the lower mold support are configured to be pressed together to form a mold cavity therebetween. The gate is disposed on a side of the mold cavity and configured to allow a mold material to be injected into the mold cavity. The vent is disposed on another side of the mold cavity opposite the gate and is configured to release gas from the mold cavity. The trenches are formed on the upper mold support and arranged along the periphery of the mold cavity to communicate the mold cavity with the vent. The shutter pin is configured to control the opening and closing of the trenches. The storage tank is formed on the lower mold support between the shutter pin and the vent and configured to collect the mold material from the mold cavity.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may vary while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A mold chase, comprising:
a lower mold support;
an upper mold support, wherein the upper mold support and the lower mold support are configured to be pressed together to form a mold cavity therebetween for receiving a wafer level substrate;
a plurality of gates disposed along a periphery of the mold cavity and configured to allow a mold material to be injected into the mold cavity;
at least one vent disposed along the periphery of the mold cavity and configured to release gas from the mold cavity;
a plurality of trenches formed on the upper mold support and arranged along the periphery of the mold cavity, configured to communicate the mold cavity with the at least one vent;
a shutter pin configured to control the opening and closing of the trenches; and
a storage tank formed between the shutter pin and the at least one vent and configured to collect the mold material from the mold cavity;
wherein a distance between one of the gates and the closest vent is less than a diameter of the mold cavity.

2. The mold chase as claimed in claim 1, wherein the gates and the at least one vent are arranged at equal intervals around the mold cavity.

3. The mold chase as claimed in claim 1, wherein the gates are formed on the upper mold support and connected to a source of the mold material.

4. The mold chase as claimed in claim 1, wherein the at least one vent is formed on the lower mold support and connected to a vacuum pump.

5. The mold chase as claimed in claim 1, wherein the mold material is injected through each of the gates into the mold cavity along a central line, and an angle of about 45 degrees is formed between the central line and an edge of a chip attached to the wafer level substrate.

6. The mold chase as claimed in claim 1, wherein gas in the mold cavity is released through the at least one vent along a central line, and an angle of about 45 degrees is formed between the central line and an edge of a chip attached to the wafer level substrate.

7. The mold chase as claimed in claim 1, wherein the storage tank is formed on the lower mold support between the shutter pin and the respective vent and configured to collect the mold material from the mold cavity.

8. The mold chase as claimed in claim 1, wherein the mold cavity is formed on the upper mold support, and a compressible releasing film is placed in the mold cavity and configured to prevent formation of the mold material on a back surface and a portion of side surfaces of a package unit attached to the wafer level substrate.

9. The mold chase as claimed in claim 1, wherein the storage tank is closer to the at least one vent than the shutter pin.

10. A mold chase, comprising:
a lower mold support;
an upper mold support, wherein the upper mold support and the lower mold support are configured to be pressed together to form a mold cavity therebetween for receiving a wafer level substrate;
a gate formed in a central region of the upper mold support and configured to allow a mold material to be injected into the mold cavity; and
a plurality of vents disposed along a periphery of the mold cavity and configured to release gas from the mold cavity;
a plurality of trenches formed on the upper mold support and arranged along the periphery of the mold cavity, configured to communicate the mold cavity with each of the vents;
a shutter pin configured to control the opening and closing of the trenches; and
a storage tank formed between the shutter pin and the respective vent and configured to collect the mold material from the mold cavity;
wherein a distance between the gate and one of the vents is less than a diameter of the mold cavity.

11. The mold chase as claimed in claim 10, wherein the distance between the gate and one of the vents is equal to or less than a radius of the wafer level substrate.

12. The mold chase as claimed in claim 10, wherein the vents are arranged at equal intervals around the mold cavity.

13. The mold chase as claimed in claim 10, wherein the vents are formed on the lower mold support and connected to a vacuum pump.

14. The mold chase as claimed in claim 10, wherein & the storage tank is formed on the lower mold support.

15. The mold chase as claimed in claim 10, wherein the mold cavity is formed on the upper mold support, and a compressible releasing film is placed in the mold cavity and configured to prevent formation of the mold material on a back surface and a portion of side surfaces of a package unit attached to the wafer level substrate.

16. The mold chase as claimed in claim 10, wherein the shutter pin is closer to the mold cavity than the storage tank.

17. A mold chase, comprising:
a lower mold support;
an upper mold support, wherein the upper mold support and the lower mold support are configured to be pressed together to form a mold cavity therebetween;
a gate disposed on a side of the mold cavity and configured to allow a mold material to be injected into the mold cavity;

a vent disposed on another side of the mold cavity opposite the gate and configured to release gas from the mold cavity;

a plurality of trenches formed on the upper mold support and arranged along a periphery of the mold cavity to communicate the mold cavity with the vent, wherein the plurality of trenches is located between the mold cavity and the vent;

a shutter pin configured to control the opening and closing of the trenches; and a storage tank formed on the lower mold support between the shutter pin and the vent and configured to collect the mold material from the mold cavity.

18. The mold chase as claimed in claim 17, wherein the storage tank is curved and arranged around the mold cavity.

19. The mold chase as claimed in claim 17, wherein a depth of each of the trenches is sufficient to allow the mold material to pass, and a depth of the storage tank is several times the depth of each of the trenches.

20. The mold chase as claimed in claim 17, further comprising at least one additional gate disposed between the gate and the vent and configured to allow the mold material to be injected into the mold cavity.

* * * * *